United States Patent
Forel et al.

(10) Patent No.: US 7,420,397 B2
(45) Date of Patent: Sep. 2, 2008

(54) LOW-CONSUMPTION INHIBIT CIRCUIT WITH HYSTERESIS

(75) Inventors: Christophe Forel, Grenoble (FR); Robert Cittadini, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 42 days.

(21) Appl. No.: 11/143,916

(22) Filed: Jun. 1, 2005

(65) Prior Publication Data

US 2005/0280451 A1    Dec. 22, 2005

(30) Foreign Application Priority Data

Jun. 2, 2004    (FR)    ................................... 04 05904

(51) Int. Cl.
    *H03L 7/00*    (2006.01)
(52) U.S. Cl. ...................................... 327/143; 327/198
(58) Field of Classification Search ................. 327/143, 327/198, 142
    See application file for complete search history.

(56) References Cited

U.S. PATENT DOCUMENTS

| | | | |
|---|---|---|---|
| 4,527,076 A * | 7/1985 | Matsuo et al. ................. | 327/88 |
| 5,103,158 A * | 4/1992 | Cho et al. ..................... | 323/314 |
| 5,414,378 A * | 5/1995 | Edgar et al. .................. | 327/143 |
| 5,828,242 A | 10/1998 | Danstrom | |
| 5,856,756 A * | 1/1999 | Sasahara et al. ............. | 327/540 |
| 5,880,611 A * | 3/1999 | Danstrom ..................... | 327/142 |
| 6,151,230 A * | 11/2000 | Savelli ......................... | 363/60 |
| 6,346,834 B1 * | 2/2002 | Chai ............................ | 327/143 |
| 6,437,614 B1 * | 8/2002 | Chen ........................... | 327/143 |
| 6,683,481 B1 | 1/2004 | Zhou et al. | |
| 6,686,783 B1 * | 2/2004 | Huang .......................... | 327/143 |
| 6,879,194 B1 * | 4/2005 | Caldwell ...................... | 327/143 |
| 6,894,544 B2 * | 5/2005 | Gubbins ....................... | 327/143 |
| 6,940,335 B2 * | 9/2005 | Otake ........................... | 327/538 |
| 6,975,164 B1 * | 12/2005 | Matsui et al. ................ | 327/541 |
| 7,030,668 B1 * | 4/2006 | Edwards ....................... | 327/143 |
| 7,116,139 B2 * | 10/2006 | Mitchell ....................... | 327/142 |
| 7,167,654 B2 * | 1/2007 | Tokita et al. ................. | 398/138 |

FOREIGN PATENT DOCUMENTS

| | | |
|---|---|---|
| FR | 2 844 118 A | 3/2004 |
| JP | 59228426 A * | 12/1984 |
| WO | WO 2004/057449 A2 | 7/2004 |
| WO | WO 2004/057449 A3 | 7/2004 |

OTHER PUBLICATIONS

FR 0405904 Preliminary Search Report, Dec. 14, 2004.

* cited by examiner

*Primary Examiner*—N. Drew Richards
*Assistant Examiner*—William Hernandez
(74) *Attorney, Agent, or Firm*—Hogan & Hartson LLP

(57) ABSTRACT

An inhibit circuit which produces an inhibit signal when a variation in a power supply potential is detected includes a comparator having a negative input connected to a generator producing a reference potential and a positive input connected to an output of a first image circuit producing a first potential that is an image of the power supply potential. The first image circuit includes a diode and a circuit for the production of a reference current parallel-connected between a common point to which the power supply potential is applied and an output of the first image circuit connected to the positive input of the comparator. The circuit has particular utility in portable integrated circuits with very low consumption when idle such as in mobile telephony.

20 Claims, 1 Drawing Sheet

LOW-CONSUMPTION INHIBIT CIRCUIT WITH HYSTERESIS

RELATED APPLICATION

The present application claims priority under 35 U.S.C. § 119 of French Patent Application No. 0405904 filed Jun. 2, 2004, which is incorporated herein in its entirety by this reference.

1. Field of the Invention

The invention relates to an inhibit circuit, especially useful for low-consumption integrated circuits for which high robustness is required. The invention can be applied, for example, in embedded applications such as mobile telephony such as GSM, etc.

In embedded applications, the consumption of an integrated circuit is a crucial problem inasmuch as the quantity of energy available, and hence the autonomy of the integrated circuit, is limited. Furthermore, especially for applications intended for mass consumption, the integrated circuits have to be robust and in particular they should be able to withstand substantial levels of undesired variations in voltage or current. Again, constraints related to the integration density of the circuits need to be taken into account when these circuits are made.

The integrated circuits used especially in embedded applications generally include an internal power supply generator, one or more functional circuits and an inhibit circuit. The internal power supply generator has the function of producing a stable power supply potential VDD from an energy source which may be a battery or else an RF energy signal. The potential VDD, which is initially at zero when the integrated circuit is powered on, rapidly increases until it reaches its stable nominal value VDD0. The functional circuits are, for example, memories, mobile telephony circuits, etc.

As for this inhibit circuit, its function is to prevent the working of the downstream functional circuits if the power supply potential VDD does not have a value sufficient to ensure the proper operation of these functional circuits. Thus, when the integrated circuit is powered on, the inhibit circuit produces an active signal that prevents the downstream functional circuits from starting so long as VDD has not reached a threshold VSM. Then, when VDD has reached its nominal value, the inhibit circuit detects a drop, if any, in the potential VDD and produces an inactive signal if VDD falls below a threshold VSD to again deactivate the downstream functional circuits.

2. Background of the Invention

A prior art inhibit circuit comprises a comparator having a negative input connected to a generator producing a reference potential VREF and a positive input to which an image of the power supply potential VDD is applied. The image is obtained by means of a resistive divider bridge that enables the potential level at the positive input to be adjusted according to the level of the potential VREF. The comparator produces an activation signal to activate or inhibit the working of the downstream functional circuits depending on whether or not the power supply potential VDD is above a threshold. When the values desired for the voltage build-up threshold and voltage build-down threshold are different, two resistive divider bridges are generally used, each giving an image of VDD at an adapted level, and the image given by the first divider bridge or the image given by the second divider bridge is applied to the positive input of the comparator depending on whether VDD is increasing or decreasing.

The prior art inhibit circuits have two main drawbacks. A first drawback is the substantial level of energy consumed by the voltage divider bridges. To reduce the power consumption, it is necessary to reduce the current flowing in such divider bridges by increasing the size of the resistors. However, this is incompatible with high integration density.

A second drawback is the sensitivity of prior art inhibit circuits which tend to react very quickly or even far too quickly to sudden, high-amplitude but short-duration variations in VDD. These sudden variations, known as "bursts" or "glitches", are inevitable in certain portable applications and especially in telephony; they are present especially at output of the power supply generator and are due, for example, to a sudden removal of the energy source used by the power supply generator. By way of an indication, for a potential VDD of the order of 3 to 3.5 V powering an integrated circuit in a GSM application, sudden variations or glitches of the order of 600 mV often occur in the potential VDD.

So long as they do not go below a certain threshold, these sudden variations are not harmful for the downstream functional circuits if they do not last. However, whenever the inhibit circuits deactivate the functional circuits after a drop in the potential VDD, the inhibit circuit must be reset before it can fully play its role again. Most usually, a resetting of the inhibit circuits also implies the deactivation and then the reactivation of the power supply generator, with all the consequences that this entails in terms of availability of the circuit and of energy consumption in particular. An excessively sensitive inhibit circuit therefore gives rise to unnecessary excess consumption of energy and lower availability of the downstream functional circuits.

SUMMARY OF THE INVENTION

According to an embodiment of the present invention, an inhibit circuit has very low energy consumption as well as low sensitivity to glitches or sudden variations in the power supply potential.

According to an embodiment of the present invention, an inhibit circuit produces an inhibit signal when a variation in a power supply potential is detected, the inhibit circuit comprising a comparator comprising a negative input connected to a generator producing a reference potential, and a positive input connected to an output of a first image circuit producing a first potential that is an image of the power supply potential.

According to an embodiment of the present invention, the first image circuit comprises a diode and a circuit for the production of a reference current parallel-connected between a common point to which the power supply potential is applied and an output of the first image circuit connected to the positive input of the comparator.

The first image circuit is a hysteresis circuit which, according to the invention, does not include any resistor, so that it consumes little energy. By the construction of the first image circuit, the first image potential is equal to the power supply potential minus a characteristic potential threshold of the diode.

The inhibit circuit according to the invention is advantageously complemented by a second image circuit to produce a second image potential proportional to the power supply potential and a selection means for the connection, to the positive input of the comparator and as a function of a selection signal, of:

either the output of the second image circuit if the power supply potential varies between zero and a build-up threshold after having taken a value below a build-down threshold, or the output of the first image circuit if the power supply potential varies between a nominal value of the power supply potential (VDD) and the build-down threshold after having taken a value greater than that of the build-up threshold.

The use of two image circuits makes it possible to obtain an inhibit circuit with two different detection thresholds, in using a simple comparator.

According to another aspect of the invention, the circuit for the production of the reference current comprises a source to produce a stable current, and means for copying said stable current to produce the reference current.

Preferably, the source comprises a set of bipolar transistors associated with a resistor forming a band-gap type structure for producing a reference current. The reference current is independent of VDD and has a very low value, without the use of high resistance.

Preferably again, the source also comprises a reset circuit to discharge a parasitic capacitor of a bipolar transistor in which the stable current flows. Thus reset, the current source produces the stable current quickly after the application of the potential VDD.

In an embodiment of the present invention, the reset circuit is a diode having a first pole to which the power supply potential is applied and a second pole connected to an emitter of said transistor in which the stable current flows.

BRIEF DESCRIPTION OF THE DRAWINGS

Other features and advantages of the invention shall appear more clearly from the following description of a preferred embodiment of an inhibit circuit according to the invention. This description is given by way of an indication that in no way restricts the scope of the invention, and is made with reference to the single appended drawing, in which.

DETAILED DESCRIPTION

Figure 1:
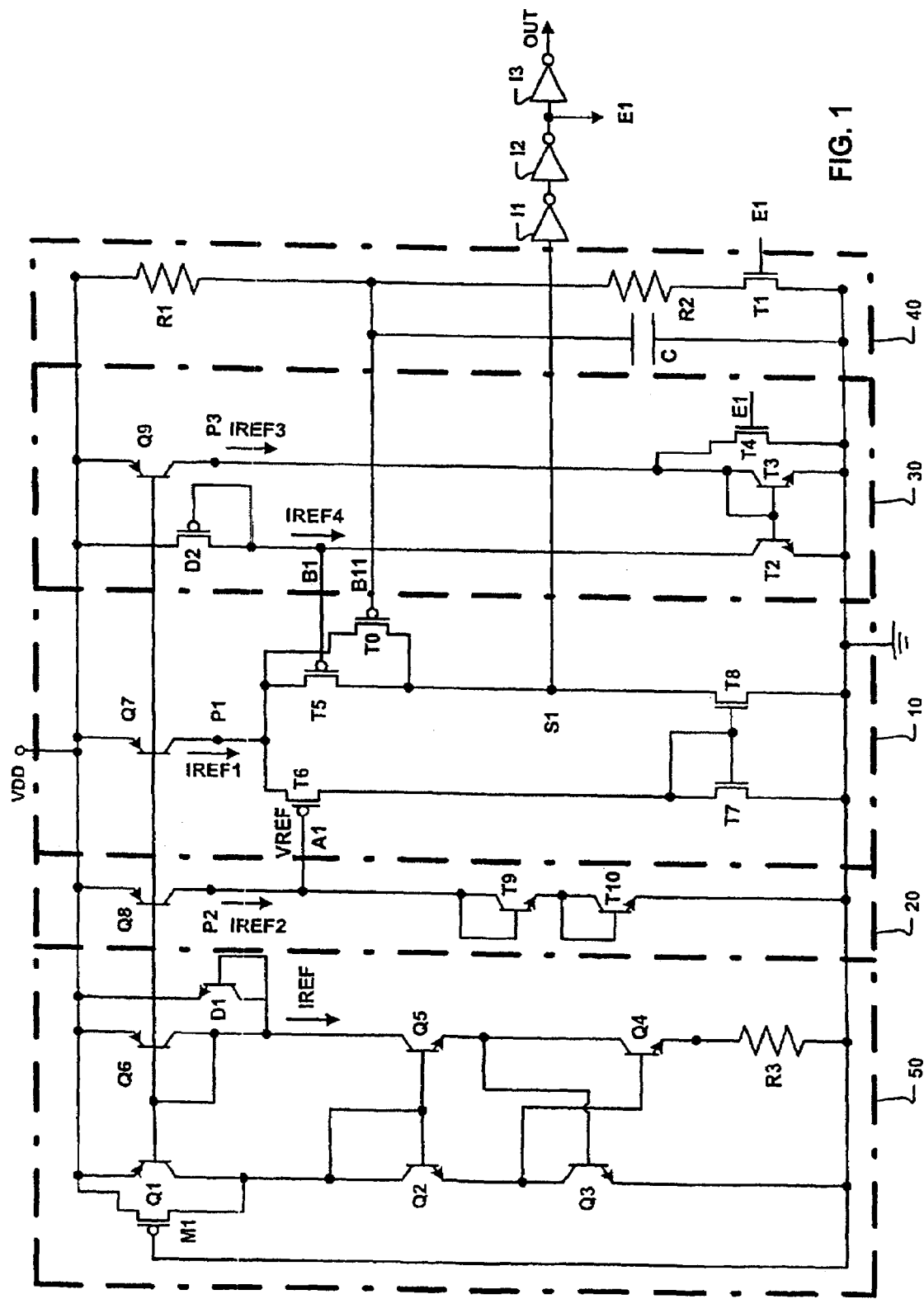
FIG. 1 is an electronic circuit of an inhibit circuit according to an embodiment of the present invention.

The circuit of FIG. 1 comprises a comparator 10, a potential generator 20, a first image circuit 30, and a second image circuit 40. The inhibit circuit monitors a potential VDD given by a generator (not shown), and produces an inhibit signal OUT designed to authorize or not authorize the working of the downstream functional circuits (not shown). When the whole integrated circuit is powered on, the potential VDD is initially zero and grows rapidly until it reaches its normal value VDD0.

The inhibit circuit also comprises a reference current generator 50, comprising nine bipolar transistors Q1 to Q9, one diode D1, one transistor M1 and one resistor R3. The generator 50 produces three independent reference currents IREF1, IREF2, IREF3; the generator 50 is functionally equivalent to three independent generators, each producing a reference current.

The transistors Q1 to Q6 and the resistor R3 are connected according to a known scheme to form a generator of stable, reference current of the VT/R type. In a first arm, the transistor Q1, which is of a PNP type, and the transistors Q2, Q3 which are of an NPN type are series-connected, the potential VDD being applied to the emitter of Q1 and the emitter of Q3 being connected to a ground of the circuit. In a second arm, the transistor Q6, which is of a PNP type and the transistors Q5, Q4 which are of an NPN type are series-connected, the potential VDD being applied to the emitter of Q6 and the emitter of Q4 being connected to a pole of the resistor R3 whose other pole is grounded. A base of Q1 is connected to a base and to a collector of Q6. A base of Q5 is connected to a base and to a collector of Q2. A base of Q3 is connected to an emitter of Q5 and a base of Q4 is connected to an emitter of Q2.

When the potential VDD is applied to the two arms of the generator 50 and when the generator has reached equilibrium, the current I0 flowing in the transistor Q6 is equal to VT/R3, VT being a well-known intrinsic parameter of a bipolar transistor equal to kT/q, k being the Boltzman constant, T the temperature and q the elementary charge. VT is equal to 26 mV for T=300 K. In choosing a resistance R3 in the range of 150 KΩ, a low current IREF of the order of 0.17 μA is thus obtained. IREF is independent of the potential VDD.

The transistors Q7, Q8, Q9 all have an emitter to which the potential VDD is applied and a base connected to the base of Q6. The transistors Q7, Q8, Q9 are copying transistors. At its collector P1, the transistor Q7 produces a current IREF1=a.IREF, at its collector P2, the transistor Q8 produces a current IREF2=b.IREF and the transistor Q9, at its collector P3, produces a current IREF3=c.IREF. IREF1, IREF2, IREF3 are thus reference currents that are quite as stable as IREF. The constants a, b, c depend on the respective sizes of the transistors Q7, Q8, Q9 relative to the size of the transistor Q6.

The three currents are used respectively by the comparator 10, the potential generator 20 and the first image circuit 30, as shall be seen here below.

The current generator 50 is complemented according to the invention by the addition of a diode D1, connected between the collector of Q5, at the potential VDD, and the collector of Q6. The diode D1 may quickly reset the current generator 50 when the potential VDD is applied to it. Indeed, the transistor Q5, because it is of a bipolar type, has a high-capacitance parasitic capacitor between its collector and the ground. The diode D1 makes it possible, when VDD falls very quickly from VDD0 to zero, to discharge this parasitic capacitor; D1 thus enables the current source to quickly become operational again when VDD rises.

The current generator 50 is also complemented by the addition of a PMOS type transistor M1 parallel-connected to the transistor Q1. The drain of M1 is connected to the collector of Q1 and its gate is connected to the ground. The potential VDD is applied to the source of M1. Since the gate of M1 is grounded, the transistor M1 is always on as soon as the potential VDD is applied, even if VDD is low and has not yet reached its nominal value. M1 enables the injection of a small current into the arm formed by the transistors Q1, Q2, Q3 so as to start the current generator as soon as it is powered on, i.e. as soon as the potential VDD is applied.

The comparator 10 is made according to a known scheme, comprising a current source (transistor Q7) producing a current IREF1 at the pole P1 and five transistors T0, T5 to T8. The P type transistor T6 and the N type transistor T7 are series-connected between the pole P1 and a ground of the circuit. The gate of T6 forms a negative input A1 of the comparator 10 and the gate of T7 is connected to its drain. The P type transistor T5 and the N type transistor T8 are series-connected between the pole P1 and the ground. The gate of T5 forms a positive input B1 of the comparator 10 and the gate of T8 is connected to the gate of T7. The P type transistor To for its part is parallel-connected to the transistor T5 and its gate forms a second positive input B11 of the comparator 10. The common drain S1 of the transistors T5, T8 is connected to the input of a series of three logic converters I1, I2, the output of the third inverter I3 forming an output OUT of the comparator 10. The three inverters form a gain stage. The inverter I1 is used to convert the analog potential at the point S1, into a clear logic signal equal to 0 or VDD. The output of the inverter I2 produces a selection signal E1. The selection signal is equal to the signal at the point S1. Here, the signal E1 is inverted to obtain the signal OUT for the activation of the downstream functional circuits.

The comparator 10 works as follows. When the potential at the positive input B1 or B11 is below the potential VREF at the negative input A1, the transistors T6, T7, T8 are off and the transistor T5 or T0, which is on, imposes a potential close to VDD at the point S1. Conversely, when the potential at the positive input B1 or B11 is greater than the potential VREF at the negative input A1, the transistor T5 or T0 is off, the transistors T6, T7, T8 are on and the transistor T8 imposes a potential close to a diode threshold, namely zero, at the point S1.

The reference potential generator 20 includes two diodes series-connected between the pole P2 of a current source (transistor Q8) producing IREF2 and the ground of the circuit. The diodes here are made from bipolar transistors T9, T10 having a base connected to a collector. The association of the two diodes thus imposes a potential VREF on the pole P2 equal to twice the emitter-base voltage of a bipolar transistor, namely voltage of the order of 1.3 to 1.4 V. The pole P2 is connected to the negative input of the comparator 10.

The first image circuit 30 has a diode D2, two NPN bipolar transistors T2, T3, one NMOS type transistor T4 and one transistor Q9 which (by copying the current IREF) produces the reference current IREF3 at the pole P3. The power supply potential VDD is applied to a first pole of the diode D2 a second pole of which is connected to the collector of the transistor T2 whose emitter is grounded. The base of the transistor T2 is connected to the base and to the collector of the transistor T3 whose emitter is grounded. The collector of T3 is furthermore connected to the pole P3 and to the drain of the transistor T4 whose source is grounded. The selection signal E1, given by the comparator 10, is applied to the gate of T4. Finally, the common point of the diode D2 and of the transistor T2 is connected to the positive input B1 of the comparator 10.

The transistor Q9 and the transistors T2, T3, T4 together form a current generator controlled by the signal E1, that is parallel-connected to the diode D2 and:
  is inactive when the signal E1 is active (VDD)
  is active and makes the current IREF4 flow in the diode D2 when the signal E1 is inactive (zero).

The general working of the circuit 30 is as follows. The transistor T4 serves to activate or deactivate the circuit 30, depending on the signal E1: when the signal E1 is active (equal to VDD), T4 is on and the current IREF3 flows towards the ground, and the circuit 30 is therefore inactive. Conversely, when the signal E1 is inactive (equal to zero), T4 is off and the current IREF3 flows toward the transistor T3. The transistors T2, T3 form a current mirror which copies the current IREF3 into a current IREF4 in the arm constituted by the diode D2 and the transistor T2. When no current flows in this arm, the potential B1 and the input of the comparator is set at VDD thus deactivating T5. When, on the contrary, the current flows in this arm (T4 off), the diode D2 imposes a potential equal to VDD-VD2 on the positive input B1 of the comparator 10. VD2 is a voltage threshold of the diode D2, of the order of 0.95 to 1 V. Since the potential at the point B1 is below VDD, the P type transistor T5 is on. The diode D2 thus makes it possible to ensure that the transistor T5 is always on when a current flows through said diode.

The second image circuit 40 for its part has two resistors R1, R2 and one NMOS transistor T1 associated in series, the potential VDD is applied to a pole of the resistor R1 and the source of the transistor T1 is grounded. The common point of the resistors R1, R2 is connected to the positive input B11 of the comparator and the selection signal E1 is applied to the gate of the transistor T1. When the signal E1 is active (equal to VDD), T1 is on, a current flows in the two resistors R1, R2 so that the common point B11 of the two resistors is at the potential VDD*R2/(R1+R2). When E1 is inactive (equal to zero), the transistor T1 is off so that the potential at the point B11 is set at VDD via R1, thus turning the transistor T0 off.

The circuit 40 is complemented by a capacitor C connected between the common point of the resistors R1, R2 and the ground. The capacitor C serves as a lowpass filter. The potential at the point B11 thus follows the fluctuations of VDD but they are delayed and dampened by the capacitor C.

It will be noted that the transistors T1, T4, which are on and off according to the signal E1, form a means for selecting the first image circuit 30 or the second image circuit 40, and for connecting either of the circuits to the positive input (more specifically to the gate of the transistor T0 or T5) of the comparator 10. Indeed, as we have just seen, when E1 is active, equal to VDD, the potential B1 is set at VDD and the potential B11 is equal to VDD*R2/(R1+R2). Conversely, when the signal E1 is inactive and equal to zero, the potential B11 is set at VDD via R1 and the potential B1 is equal to VDD−VD2.

It will also be noted that the assembly formed by the comparator 10 and the image circuits 30, 40 form a hysteresis comparator with two thresholds, whose general functioning is known and described here below.

When the power is turned on, VDD is low, the potential at the point S1 is close to VDD and the signal E1 is equal to VDD. The circuit 30 is inactive (with the potential B1 set at VDD) and the circuit 40 is active: the potential B11 is equal to VDD*R2/(R1+R2). So long as B11 is lower than VREF, namely VDD below VSM=VREF*(R1+R2)/R2, the potential S1 remains equal to VDD and the signal OUT is inactive: the downstream functional circuits are reset.

When VDD goes beyond the threshold VSM, the comparator 10 switches over, the potential at the point S1 goes to zero, the signal OUT takes the value VDD and activates the downstream functional circuits. The signal E1 for its part is equal to zero and the transistors T1, T4 are turned off. With T1 being off, the circuit 40 is inactive and the potential B11 is set at VDD. With T4 being off, the transistors T2, T3 are on so that the potential at the point B1 is equal to VDD−VD2. So long as B1 is greater than VREF, namely so long as VDD is greater than VSD=VREF+VD2, the potential at the point S1 remains at zero and the signal OUT is kept at VDD, which is active.

In practice, the diode D2, the generator 20 producing VREF and the resistors R1, R2 are sized as a function of the values desired for the thresholds VSM, VSD. In one example, the values of VSM, VSD are chosen to be of the order of 1.8 to 2.0 V for a potential VDD of 3 V.

As compared with prior art inhibit circuits, the inhibit circuit of the invention as described here above consumes very little energy. Indeed, the circuit 40, which consumes energy owing to the presence of the resistors R1, R2, is active only during the phase when the integrated circuit is started up, namely when the system is powered on and until the potential VDD has reached the threshold VSM. Since this phase is very short, the corresponding consumption of energy is also limited. The circuit 30 for its part is active throughout the duration of operation of integrated circuit, to detect a possible drop in potential VDD. The circuit 30 however, which is made solely from transistors, consumes very little energy.

The consumption of the inhibit circuit according to the invention is also limited by the use of a current generator 50 giving very low current IREF and consuming very little energy. Since IREF is equal to VT/R3, it is possible to obtain low current with lower resistance R3 inasmuch as VT is low (25 mV for a temperature of 300K).

It must be noted again that the comparator 10 (and therefore also the inhibit circuit) cannot fulfill its function so long that the current IREF is not available and so long as VDD has not reached a minimum value VMIN sufficient to turn on one of the two arms of the comparator 10. This is not a problem inasmuch as:

the current IREF is available very quickly after the power is turned on, especially through the transistor M1 and above all through the diode D1 of the current generator 50, in the case of a short drop in the power supply potential VDD the minimum value VMIN is fixed by the voltage thresholds of the transistors Q7, T6, T7, whose sum (of the order of 1.5 V) is below the switching threshold VSM.

The inhibit circuit is thus active well before the potential VDD becomes sufficient to properly power the downstream functional circuits.

Finally, it must be noted that the inhibit circuit has low sensitivity to VDD glitches that have a mean amplitude below 1 V but are short-lived. This is because of the presence of the capacitor C in the circuit 40.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An inhibit circuit to produce an inhibit signal when a variation in a power supply potential is detected, the inhibit circuit comprising a comparator comprising a negative input connected to a generator producing a supply independent reference potential, and a positive input connected to an output of a first image circuit producing a first potential that is an image of the power supply potential,
wherein the first image circuit comprises a diode and a circuit for the production of a reference current each directly coupled to a common point to which the power supply potential is applied, and an output of the first image circuit is coupled to the positive input of the comparator.

2. A circuit according to claim 1, wherein the first image potential is equal to the power supply potential minus a characteristic potential threshold of the diode.

3. A circuit according to claim 1, further comprising:
a second image circuit to produce a second image potential proportional to the power supply potential and a selection means for the connection, to the positive input of the comparator and as a function of a selection signal, either
the output of the second image circuit when the power supply potential varies between zero and a build-up threshold after having taken a value below a build-down threshold, or
the output of the first image circuit when the power supply potential varies between a nominal value of the power supply potential and the build-down threshold after having taken a value greater than that of the build-up threshold.

4. A circuit according to claim 3, wherein the first image circuit comprises a first transistor having a gate for receiving the selection signal and the second image circuit comprises a second transistor having a gate for receiving the selection signal.

5. A circuit according to claim 1, wherein the circuit for production of a reference current comprises a source to produce a stable current, and means for copying said stable current to produce the reference current.

6. A circuit according to claim 5, wherein the source comprises a set of bipolar transistors associated with a resistor forming a structure producing the reference current equal to VT divided by the resistor value, VT being a characteristic parameter of a bipolar transistor and wherein the source also comprises a reset circuit to discharge a parasitic capacitor of a bipolar transistor in which the stable current flows.

7. A circuit according to claim 6, wherein the reset circuit is a diode having a first pole to which the power supply potential is applied and a second pole connected to an emitter of said bipolar transistor in which the stable current flows.

8. A circuit according to claim 2, further comprising: a second image circuit to produce a second image potential proportional to the power supply potential and a selection means for the connection, to the positive input of the comparator and as a function of a selection signal, either
the output of the second image circuit when the power supply potential varies between zero and a build-up threshold after having taken a value below a build-down threshold, or
the output of the first image circuit when the power supply potential varies between a nominal value of the power supply potential and the build-down threshold after having taken a value greater than that of the build-up threshold.

9. A circuit according to claim 8, wherein the first image circuit comprises a first transistor having a gate for receiving the selection signal and the second image circuit comprises a second transistor having a gate for receiving the selection signal.

10. A circuit according to claim 9, wherein the circuit for production of a reference current comprises a source to produce a stable current, and means for copying said stable current to produce the reference current.

11. An inhibit circuit to produce an inhibit signal when a variation in a power supply potential is detected, the inhibit circuit comprising:
a comparator comprising a negative input for receiving a reference potential, and a positive input;
a first image circuit for producing a first potential that is an image of a power supply potential, wherein the first image circuit comprises a diode and a circuit for the production of a reference current each coupled to the power supply potential, and an output of the first image circuit being coupled to the positive input of the comparator;

a second image circuit to produce a second image potential proportional to the power supply potential; and a selection circuit for coupling either of the first image circuit or the second image circuit to the positive input of the comparator as a function of a selection signal.

12. The circuit according to claim 11, wherein the first potential is equal to the power supply potential minus a characteristic potential threshold of the diode.

13. The circuit according to claim 11, wherein the selection circuit couples an output of the second image circuit to the comparator if the power supply potential varies between zero and a build-up threshold after having taken a value below a build-down threshold.

14. The circuit according to claim 11, wherein the selection circuit couples the output of the first image circuit to the comparator if the power supply potential varies between a nominal value of the power supply potential and a build-down threshold after having taken a value greater than that of a build-up threshold.

15. The circuit according to claim 11, wherein the selection circuit comprises:

a first transistor coupled to the first image circuit having a gate for receiving the selection signal; and a second transistor coupled to the second image circuit having a gate for receiving the selection signal.

16. The circuit according claim 11, further comprising a reference current production circuit comprising a source to produce a stable current, and means for copying said stable current to produce the reference current.

17. The circuit according to claim 16, wherein the source comprises a plurality of bipolar transistors associated with a resistor R forming a structure for providing a reference current equal to VT/R, VT being a characteristic parameter of a bipolar transistor.

18. The circuit according to claim 16, wherein the source further comprises a reset circuit to discharge a parasitic capacitor of a bipolar transistor in which the stable current flows.

19. The circuit according to claim 18, wherein the reset circuit is a diode having a first pole to which the power supply potential is applied and a second pole coupled to an emitter of said bipolar transistor in which the stable current flows.

20. An inhibit circuit comprising:

a comparator having a negative input, first and second positive inputs, and an output;

a reference generator coupled to the negative input of the comparator;

a first image circuit selectively coupled to the first positive input;

a second image circuit selectively coupled to the second positive input;

a selection circuit coupled to the first image circuit, the second image circuit, and the output of the comparator; and an inverter coupled to the output of the comparator for providing an inhibit signal when a variation in a power supply coupled to the comparator, reference generator, and first and second image circuits is detected.

* * * * *